United States Patent [19]
Olivieri et al.

[11] 3,982,271
[45] Sept. 21, 1976

[54] HEAT SPREADER AND LOW PARASITIC TRANSISTOR MOUNTING

[75] Inventors: Daniel Olivieri, Huntington Station, N.Y.; Robert James Socci, Delran, N.J.

[73] Assignee: RCA Corporation, New York, N.Y.

[22] Filed: Feb. 7, 1975

[21] Appl. No.: 548,010

[52] U.S. Cl. ............................. 357/81; 333/84 M; 357/68; 357/74
[51] Int. Cl.² ..................... H01L 23/02; H01P 3/08
[58] Field of Search .............. 333/84 M; 357/74, 79, 357/81, 68

[56] References Cited
UNITED STATES PATENTS

| | | | |
|---|---|---|---|
| 3,686,457 | 8/1972 | Dubac et al. | 200/166 C |
| 3,823,351 | 7/1974 | Chambers | 357/74 |
| 3,908,188 | 9/1975 | Kawamoto | 357/81 |
| 3,913,040 | 10/1975 | Rosen et al. | 357/81 |

Primary Examiner—Stanley D. Miller, Jr.
Attorney, Agent, or Firm—Edward J. Norton; Joseph D. Lazar; Robert M. Rodrick

[57] ABSTRACT

An apparatus for heat spreading and low parasitic transistor mounting in high power microstrip circuit applications. An electrically and thermally conductive strip is conductively affixed to the ground plane of a substrate containing the circuit. The strip is shaped to fit substantially within a slot in a circuit carrier block (heat sink) such that the strip makes intimate contact between the mounting surface of the transistor mounted in the slot and the carrier block. The strip provides the electrical connection between the ground plane of the substrate and the carrier block in addition to increasing the surface area for more efficient heat transfer, and thus, allows for the ground plane of the substrate to be attached to the block either by a non-metallic adhesive or by solder.

7 Claims, 2 Drawing Figures

HEAT SPREADER AND LOW PARASITIC TRANSISTOR MOUNTING

The invention herein described was made in the course of or under a contract or subcontract thereunder with the Department of the Army.

BACKGROUND OF THE INVENTION

1. Field of the Invention

This invention relates to an apparatus for transistor mounting in a high power microstrip circuit to improve heat spreading and reduce parasitic effects.

2. Description of the Prior Art

Transistors used in high power microstrip applications generally rely on torqued screws to achieve low thermal contact resistances in transferring dissipated power into a circuit carrier block or into a slot formed in the carrier block for mounting the transistors. Circuit performance is dependent not only upon the intimate contact between the carrier block and the mounting surface of the transistor, but also on the intimate contact between the ground plane of the substrate and the block. Voids between these surfaces introduce undesirable parasitics and vary the impedance match into the transistor to thereby detune the circuit.

Prior art arrangements are dependent upon a metallic contact between the substrate ground plane and the carrier block, solder being used for this purpose. Because of the impurities of the solder and the entrapment of gases upon melting of solder, voids and air gaps commonly occur. The voids and air gaps detrimentally affect the circuit impedance resulting in a degradation of circuit performance and reduction of reproducibility.

SUMMARY OF THE INVENTION

The present invention is directed to heat spreading and low parasitic mounting of a transistor used in high power microstrip applications. An electrically and thermally conductive strip is conductively affixed to the ground plane of a substrate containing the circuit. The strip, thin, soft and therefore deformable, is fitted within a slot formed in a circuit carrier block (heat sink) such that when the transistor is mounted the strip makes intimate contact between the mounting surface of the transistor and the carrier block. The strip provides an electrical connection between the substrate ground plane and the carrier block and allows for the substrate to be attached to the carrier either by a non-metallic adhesive or by solder. Utilization of the strip precludes the detrimental effect caused by possible voids which commonly occur in solder alone between the substrate ground plane and carrier block to thereby minimize parasitics and circuit impedance matching problems and increase circuit performance reproducibility.

DETAILED DESCRIPTION OF THE PREFERRED EMBODIMENT

Figure 1:
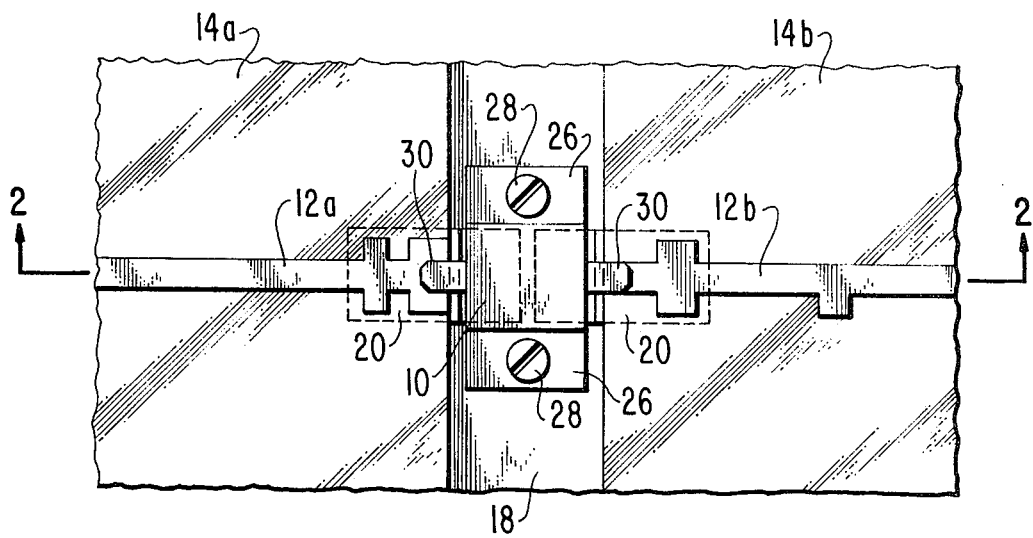
FIG. 1 is a plan view of an apparatus including a transistor mounted in a microstrip circuit embodying the invention.
Figure 2:
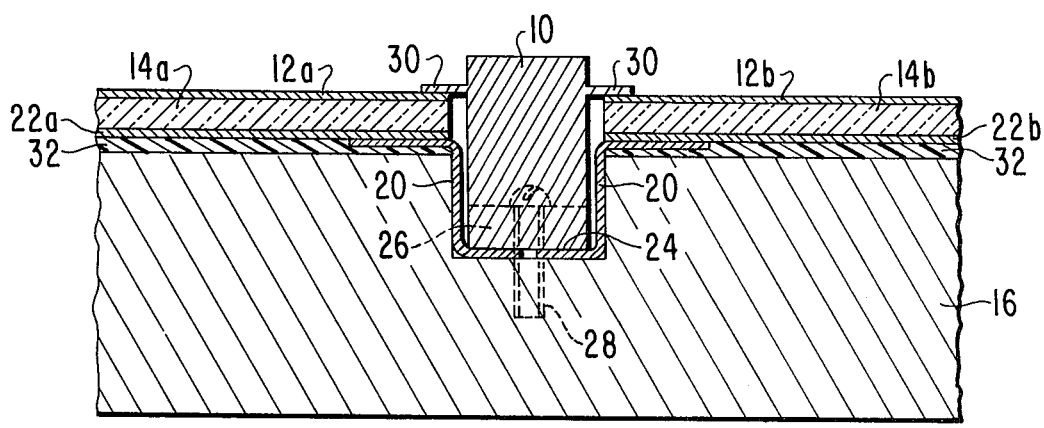
FIG. 2 is a sectional view of the apparatus showing an embodiment of the invention as seen along viewing line 2—2 of FIG. 1.

Referring to FIGS. 1 and 2, a transistor 10 of the type used in high power microstrip applications is shown mounted within a slot 18 formed in a mounting block 16 serving as a carrier for the microstrip circuit. Carrier block 16 serves both as a heat sink and as an electrical ground and may be formed of copper or other thermally conductive metal.

Transistor 10 is suitably a flanged type transistor having flanges 26 for mounting the transistor to carrier block 16 with screws 28.

A microstrip circuit comprising an input circuit 12a and an output circuit 12b is formed on one face of the non-conductive substrates 14a and 14b to a particular pattern. The input and output circuits 12a and 12b are respectively suitably formed to provide the desired impedance for the circuit in a manner well-known in the art. In a typical application for a high-power transistor in a Class C amplifier operation the input and output impedances, 12a and 12b, are arranged to couple a typically 50 ohm strip line impedance to the low impedance of the transistor. The opposite faces of substrates 14a and 14b are provided respectively with electrically conductive ground planes 22a and 22b. As seen in FIG. 2, substrate 14a is mounted on carrier block 16 to form the input circuit and substrate 14b is mounted on 16 to form the output circuit. Each is positioned to adjoin the respective edges of slot 18. Transistor leads 30 connected to two terminals of the transistor are bonded to the input and output circuit on either side of slot 18 to form the required electric circuit. The mounting surface 24 of transistor 10 is electrically connected to the third terminal of the transistor. A suitable voltage source (not shown) for providing the required supply voltage and bias voltages is connected to the transistor. Thus, the microstrip circuit formed consists of input and output circuit 12a and 12b, an active (transistor) device in the form of transistor 10 and a ground plane to be described.

In mounting transistors in high power microstrip applications it is required for proper circuit operation that the ground plane of the substrate intimately contact the carrier block on which the transistor is mounted. Intimate contact between the mounting surface of the transistor and the carrier block is required not only for proper circuit performance but also for effective dissipation of heat generated by the transistor into the carrier block.

According to the present invention the required contacts are achieved by utilizing an electrically and thermally conductive strip 20 in the transistor mounting arrangement. Strip 20 is quite thin, soft, and deformable and yet sufficiently wide to overlap and extend substantially beyond the projection of the microstrip circuit. Strip 20 is conductively affixed (in a manner to be further described) to the substrate ground planes 22a,b and formed to fit substantially within slot 18 and under the mounting surface 24 (and thus one terminal) of transistor 10. When transistor 10 is secured to carrier block 16 by mounting screws 28, strip 20 is clamped between the mounting surface 24 and slot 18. Since strip 20 is conductively affixed to ground planes 22a,b and clamped between transistor 10 and carrier block 16, intimate contact and thereby electrical connection is achieved not only between ground planes 22a,b and carrier block 16 but also between transistor 10 and carrier block 16. In addition, strip 20 extending beyond the portion of the apparatus consisting of the microstrip circuit increases the surface area for dissipating heat from transistor 10 effectively spreading thereby the heat into the carrier block 16 and increasing the reliability of the transistor by lowering its operating temperature.

In the prior art arrangements, the electrical connection between the substrate ground plane and carrier block, particularly in the region adjacent the transistor, is achieved by a metallic bond such as solder. For proper circuit performance, it is essential to maintain intimate and uninterrupted contact since discontinuities in the solder connection detrimentally affect electrical operation as discussed above. Use of solder often results in voids and air gaps in the contact joint because of solder impurities and gases entrapped upon melting of the solder. Such discontinuities introduce undesirable parasitics deleteriously affecting circuit impedance which not only degrade circuit performance but reduce circuit reproducibility. Strip 20 alone achieves intimate and uninterrupted contact between substrate ground planes 22a,b and carrier block 16. In accordance with a preferred form of the invention, a nonmetallic adhesive 32 may be used to mount substrates 14a,b to the carrier block 16. It will be appreciated however, that a strip 20 may still be used with the conventional solder bond of the ground planes 22a,b to the carrier block 16 to provide the advantages of assured electrical connection between the ground planes 22a,b and the transistor 10 as well as improving the heat dissipation of the circuit. The use of non-metallic adhesive 32 in the preferred form of the invention advantageously reduces costs since the adhesive and its application are relatively inexpensive as compared with solder.

It is preferable that strip 20 be made of soft, high thermal conductivity copper for ease of forming and for its good thermal and electrical properties. To affix the copper strip 20 to substrate ground planes 22a,b it is further preferable to gold-plate copper strip 20 so that strip 20 may be fusion bonded to substrate ground planes 22a,b. Fusion bonding as known in the art will not only assure good electrical contact between ground planes 22a,b and strip 20 but also provide good mechanical joints free of voids and gaps.

For ease of assembly, strip 20 may be divided in two portions (as illustrated in the drawing), one portion of strip 20 being affixed to ground planes 22a and 22b respectively on either side of slot 18 and both portions being secured under mounting surface 24. Strip 20 is formed to a chosen predetermined geometry to achieve maximum heat spreading efficiency. For a typical arrangement using a 5–6 watt transistor such as a type PHI 8083 available from Power Hybrids Inc. of Torrance, California, the thickness of the strip 20 is suitably 3 mils, the overall length of two strip portions is 0.5 inch, and the width is 0.38 inch. Optimum relations of these parameters may be determined to suit particular applications.

It is also preferable for high power devices, in addition to the use of mounting screws 28, to fusion bond the gold-plated strip 20 to mounting surface 24 of transistor 10. The so-provided metallic bond between transistor 10 and strip 20 will provide a low thermal resistance interface thereby increasing the thermal conductance path from transistor 10 to strip 20. Securing transistor 10 to carrier block 16 by screws 28 will then establish good contact between strip 20 and carrier block 16 and thereby good contact between transistor 10 and carrier block 16.

It is now to be appreciated that the invention provides an improvement in the mounting of a transistor in high power microstrip applications. Utilization of a thermally and electrically conductive strip to achieve intimate and uninterrupted contact between the substrate ground plane and the circuit carrier block allows for use of a nonmetallic adhesive or solder to mount the substrate to the carrier. The difficulties in achieving a continuous bond with solder alone are avoided and the undesirable parasitics and circuit impedance matching problems are minimized. Furthermore, the use of the strip increases the heat dissipating capability from the transistor to the carrier, enhances circuit performance reproducibility and provides a cost-reduced mounting arrangement.

What is claimed is:

1. In a transistor mounting apparatus of the type used in high power microstrip circuits including a transistor wherein said transistor is mounted in a slot formed in a circuit carrier block formed of electrically and thermally conductive material serving as a heat sink and electric ground, further including a non-conductive substrate having on one face a strip line conductor and on the other face a conductive ground plane, said ground plane being positioned to be mounted on said circuit carrier block, said substrate, including said strip line conductor and said ground plane arranged to receive said transistor, and further including electrically conductive connections between said transistor and said strip line conductor, the improvement comprising:
 a strip of thin, soft, deformably, electrically and thermally conductive material, said strip being positioned in said slot and clamped against the bottom wall of said slot by said transistor, the respective ends of said strip being joined with an electrical and thermal connection to said ground plane at respective opposite portions thereof adjacent said slot, said ground plane including said strip ends being affixed to said block.

2. An apparatus according to claim 1, wherein said strip is gold-plated, soft, high thermal conductivity copper.

3. An apparatus according to claim 1, wherein said strip is joined to said ground plane by a fusion-bond.

4. An apparatus according to claim 1, wherein said strip is connected to said transistor by a fusion-bond.

5. An apparatus according to claim 1, wherein said strip is wider than said strip line.

6. An apparatus according to claim 1, wherein said ground plane is affixed to said block by a non-metallic adhesive.

7. An apparatus according to claim 1, wherein said ground plane is affixed to said block by a metallic solder.

* * * * *